United States Patent
Gurumurthy et al.

(10) Patent No.: US 6,858,475 B2
(45) Date of Patent: Feb. 22, 2005

(54) METHOD OF FORMING AN INTEGRATED CIRCUIT SUBSTRATE

(75) Inventors: Charan K. Gurumurthy, Chandler, AZ (US); Hamid Azimi, Chandler, AZ (US); Arthur K. Lin, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/612,282

(22) Filed: Jun. 30, 2003

(65) Prior Publication Data

US 2004/0266070 A1 Dec. 30, 2004

(51) Int. Cl.⁷ .............................................. H01L 21/82
(52) U.S. Cl. ...................... 438/128; 438/129; 438/612; 438/614; 438/674
(58) Field of Search ................................ 438/107–108, 438/128–129, 612–614, 617, 674; 257/777–782, 784, 786

(56) References Cited

U.S. PATENT DOCUMENTS

| | | | | |
|---|---|---|---|---|
| 4,205,099 A | * | 5/1980 | Jones et al. ................. | 438/614 |
| 5,773,889 A | * | 6/1998 | Love et al. .................. | 257/737 |
| 6,249,053 B1 | * | 6/2001 | Nakata et al. ............... | 257/738 |
| 6,406,991 B2 | * | 6/2002 | Sugihara ..................... | 438/613 |
| 6,486,551 B1 | * | 11/2002 | Sato et al. ................... | 257/737 |
| 6,653,742 B1 | * | 11/2003 | Lin .............................. | 257/783 |
| 6,713,376 B2 | * | 3/2004 | Sugihara ..................... | 438/613 |
| 2003/0011070 A1 | * | 1/2003 | Iijima et al. ................. | 257/734 |
| 2003/0080408 A1 | * | 5/2003 | Farnworth et al. .......... | 257/698 |
| 2003/0232486 A1 | * | 12/2003 | Mashino ..................... | 438/455 |
| 2004/0067604 A1 | * | 4/2004 | Ouellet et al. .............. | 438/108 |

* cited by examiner

*Primary Examiner*—Lynne A. Gurley
(74) *Attorney, Agent, or Firm*—Schwegman, Lundberg, Woessner & Kluth, P.A.

(57) ABSTRACT

A method of forming an integrated circuit substrate that may be adapted to be attached to one or more electronic components. The method includes applying a resist to a back side of a substrate which includes patterned conductive layers on a front side and a back side of the substrate. The method further includes removing part of the patterned conductive layer from the front side of the substrate to form pads and interconnects on the front side of the substrate and applying another resist to the front side of the substrate. The method also includes forming a pattern in each resist that exposes the pads on the front and back sides of the substrate and applying electrolytic nickel to the pads on the substrate.

27 Claims, 7 Drawing Sheets

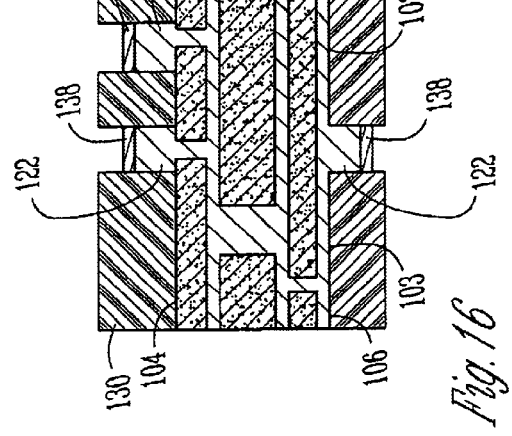
Fig. 16
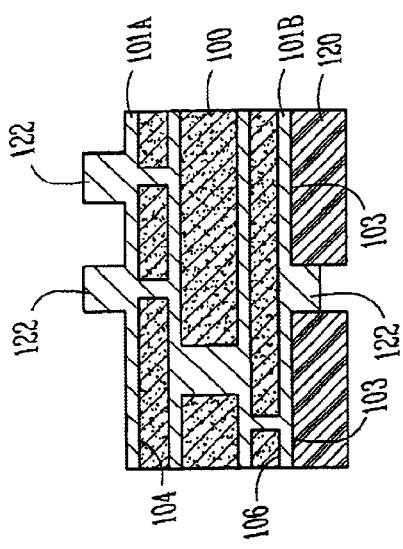
Fig. 15
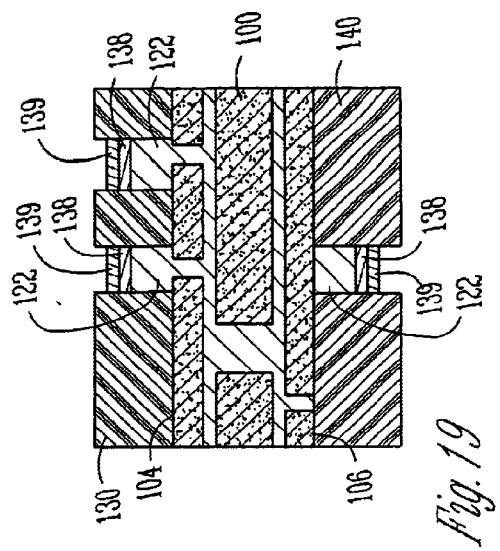
Fig. 19
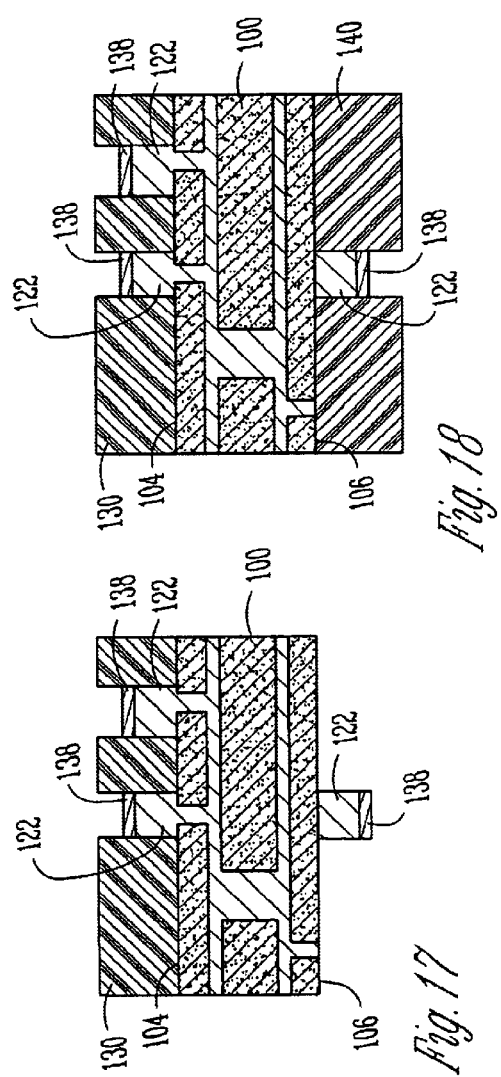
Fig. 18
Fig. 17

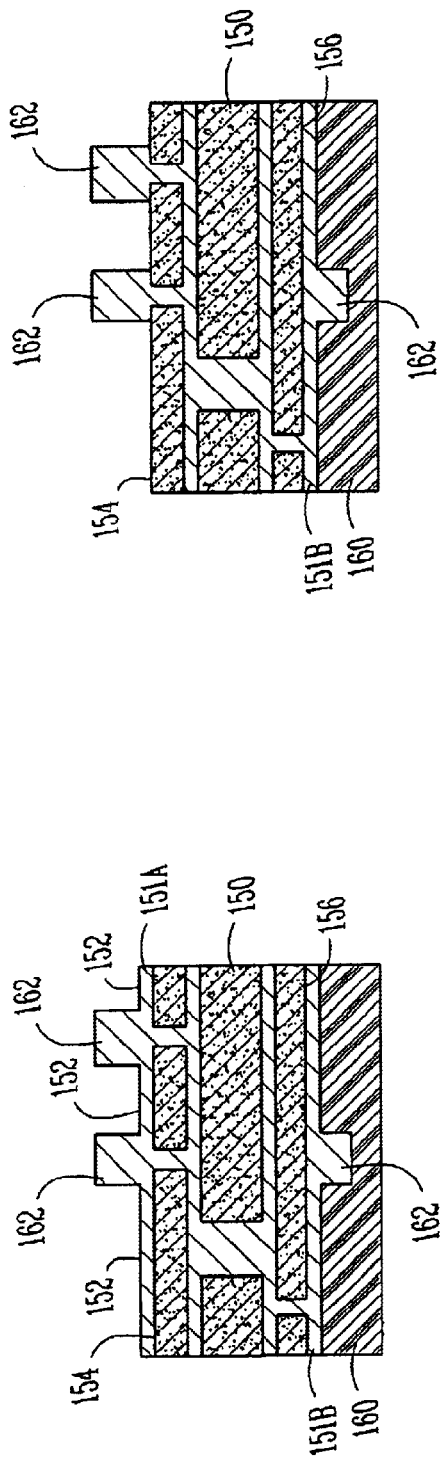
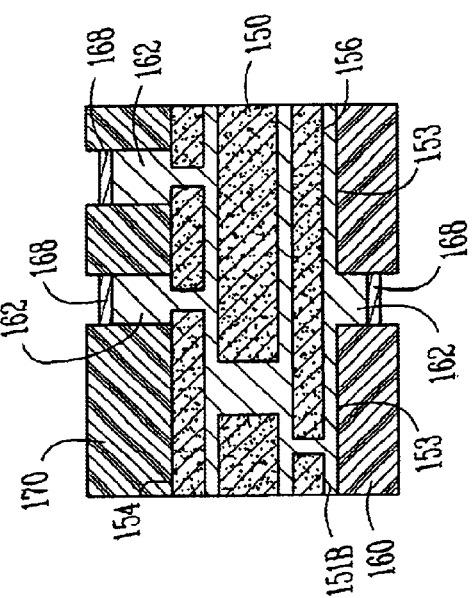

METHOD OF FORMING AN INTEGRATED CIRCUIT SUBSTRATE

TECHNICAL FIELD

A method for making semiconductor devices, and in particular semiconductor devices having improved conduction paths.

BACKGROUND

A substrate is a relatively flat and rigid structure that provides mechanical support for a die in an IC package and typically transmits signals and power to and from the IC. A conventional substrate often includes conductive leads that are connected to the die so that the die exchanges signals with other dice and/or circuits in the IC package in addition to other circuits that may be connected to the IC package. IC packages are often applied to circuit board assemblies that are part of systems of interconnected IC packages which form electronic devices such as computers or cellular phones.

One method of bonding a die to a substrate in an IC package is flip-chip bonding. One version of flip-chip bonding is known as the controlled collapse chip connection, or C4 method. The C4 method typically includes placing solder bumps on bonding pads that are exposed on the dice. The solder bumps are usually placed on the dice before the dice are separated from the wafer. Each die is then turned over (i.e., flipped) and aligned with a corresponding pattern of bonding pads or solder bumps on a substrate. A reflow procedure is carried out to join the bumps/pads on the substrate and die to form a series of solder columns between the die and the substrate. The solder columns serve as conductive paths between the die and the substrate through which signals are transmitted and power is delivered.

Substrates are typically mounted onto a board, such as a motherboard. One method of forming the interconnects between the substrate and the board is called ball grid array (BGA). In a BGA, an array of solder balls (larger than the C4 solder connection) is melted and formed on the substrate. The entire substrate is then inverted onto the surface of the board to connect the BGA to the board by again melting the solder to form solder joints.

The pads on most types of substrates are typically made of copper that is covered with a surface finish before solder is added to form the pads which are connected to a die. Electroless nickel and immersion gold are presently used as the surface finish for C4 and BGA pads in high density interconnect substrates.

The electroless nickel provides a barrier that is critical in reducing electro-migration between the copper and the solder that form the pads. Electro-migration can cause reliability problems in pads, especially in high current applications where there may be unacceptable levels of electro-migration between the copper and solder.

The immersion gold provides an oxidation barrier to the electroless nickel. The oxidation barrier is crucial because nickel oxide readily forms on electroless nickel and it is difficult to bond any material, especially solder, to thick nickel oxide.

There are reliability concerns associated with using electroless nickel as a barrier because phosphorous ends up in the electroless nickel when the electroless nickel is applied to the copper pad. The phosphorous ends up in the electroless nickel that is formed on the pads because of the manner in which electroless nickel is applied to the pad.

An alternative to applying an electroless nickel and immersion gold surface finish on pads in high density interconnect (HDI) substrates is to apply direct immersion gold right onto the copper pads. A direct immersion gold surface finish provides enhanced toughness of the solder joint/pad interface.

One drawback associated with using a direct immersion gold surface finish is that it does not include a barrier. Therefore, a direct immersion gold surface finish may not be reliable due to electro-migration, particularly in high-powered CPU applications which involve higher current and temperatures for extended periods of time.

HDI substrates typically utilize solder resists that are patterned to form openings over the pads and/or interconnects. The openings over the pads and/or interconnects are adapted to receive the solder that forms the finished pads which are attached to the die. The solder resists need to be strongly bonded directly to the surface finish of the bonding pads so that a strong joint can be formed between the copper and the solder. Therefore, using direct immersion gold as surface finish for the pads causes another concern because it is extremely difficult for the solder resist material to be bonded directly to a gold surface.

BRIEF DESCRIPTION OF THE DRAWINGS

FIGS. 11–19 illustrate another method of forming a substrate.

FIGS. 20–25 illustrate a method of forming an integrated circuit.

In the FIGS., like reference numbers refer to like elements.

DETAILED DESCRIPTION

In the following detailed description, reference is made to the accompanying drawings that show some example embodiments. These embodiments are described in sufficient detail to enable those skilled in the art to practice the invention. Other embodiments may be used, and structural, logical, and electrical changes made, without departing from the scope of the invention.

Figure 1:
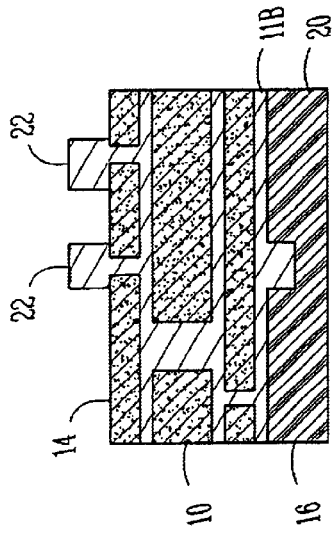
FIGS. 1–5 illustrate a method of forming a substrate.

FIGS. 1–5 illustrate a method of forming a substrate, such as a high density interconnect substrate for an integrated circuit, in accordance with various embodiments. As shown in FIG. 1, the method may include applying a resist 20 to a back side 16 of a substrate 10 that includes patterned conductive layers 11A, 11B on a front side 14 and the back side 16 of the substrate 10. In various embodiments, conductive layers 11A, 11B may be made of copper, and resist 20 may be an organic material, such as an epoxy/acrylic material.

Figure 2:
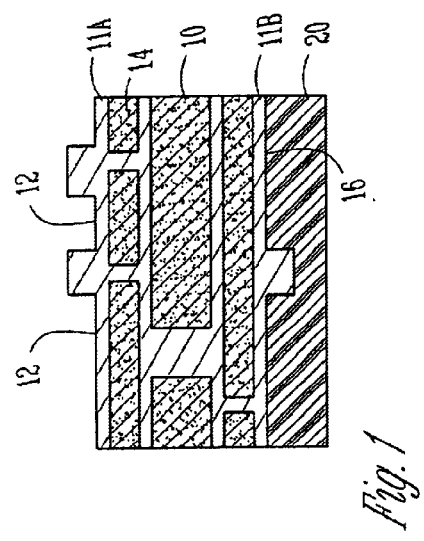

FIG. 2 illustrates that the method may further include removing part 12 (see FIG. 1) of the patterned conductive layer 11A from the front side 14 of the substrate 10 to form pads 22 and/or interconnects on the front side 14 of the substrate 10. The part 12 of the patterned conductive layer 11A may be removed by various processes, including etching (e.g., wet etching).

Figure 3:
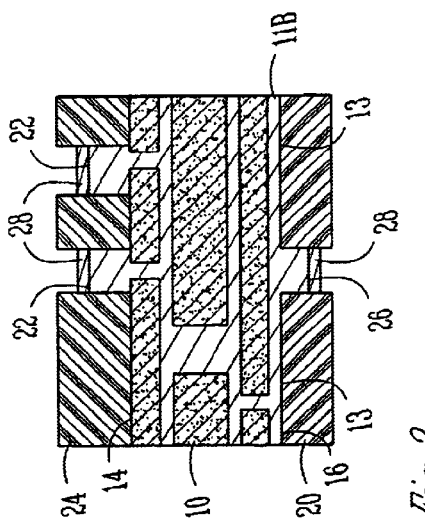

As shown in FIG. 3, the method may further include applying another resist 24 to the front side 14 of the substrate 10 and forming a pattern in each resist 20, 24 that exposes the pads 22 on the front side 14 of the substrate 10 and pads 26 on the back side 16 of the substrate 10. In various embodiments, resist 24 may be an organic material, such as epoxy/acrylic material. In addition, resist 24 may be patterned by lithographic processes, such as photolithographic processes.

The method may further include applying electrolytic nickel 28 to the pads 22, 26 on the substrate 10. Electrolytic nickel 28 may be applied to pads 22, 26 on both sides 14, 16 of the substrate 10 because conductive layer 11B is in place on the back side 16 of the substrate 10 to form part of an electrical path between the pads 22, 26.

In various embodiments, applying electrolytic nickel 28 to the pads 22, 26 on the substrate may include applying electrolytic nickel to some of the pads 22, 26 on one or both sides 14, 16 of the substrate. Electrolytic nickel 28 is nickel that is applied to the pads 22 on the substrate 10 by various processes, such as by plating or applying current to the substrate 10 while the substrate is immersed in an electrolyte that includes nickel ions.

Figure 4:
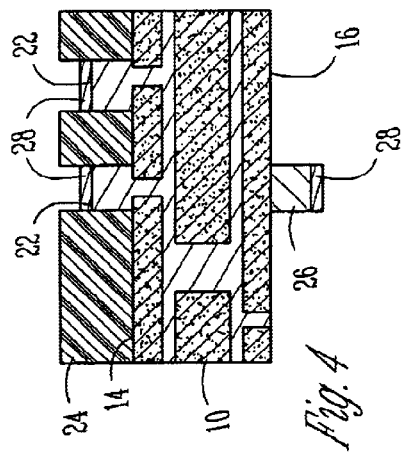

FIG. 4 illustrates an example form of the method that further includes removing the resist 20 from the back side 16 of the substrate 10 and removing a part 13 (see FIG. 3) of the conductive layer 11B from the back side 16 of the substrate 10 to form the pads 26 and/or interconnects on the back side 16 of the substrate 10. The resist 20 and part 13 of the conductive layer 11B may be removed by various processes, such as wet etching.

Figure 5:
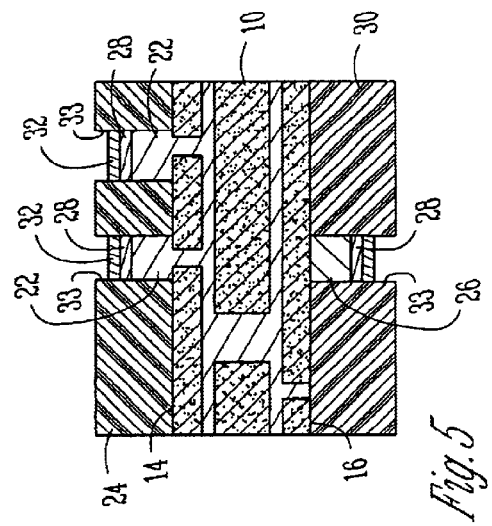

As shown in FIG. 5, the method may further include applying a further resist 30 to the back side 16 of the substrate 10 and forming a pattern in the resist 30 that exposes the pads 26 on the back side 16 of the substrate 10. In various embodiments, resist 30 may be an organic material, such as an organic epoxy/acrylic material. In addition, resist 30 may be patterned by lithographic processes, such as photolithographic processes.

The method may further include applying gold, such as electroless gold 32, to the electrolytic nickel 28 that may be on the pads 22, 26 which are within the pattern of one or both of the resists 24, 30 on the front and back sides 14, 16 of the substrate 10 (see FIG. 5). The gold 32 may be applied by conventional immersion processes. In various alternative embodiments, electrolytic gold may be applied to the electrolytic nickel 28 while all of the pads 22, 26 are still electrically connected (i.e., before the part 13 of the conductive layer 11B is removed from the back side 16 of the substrate 10 to expose pads 26 as shown in FIG. 4).

Applying gold to the electrolytic nickel provides an oxidation barrier that minimizes the amount of nickel oxide which forms on the electrolytic nickel. Minimizing the amount of nickel oxide may facilitate the bonding of material, especially solder, to pads 22, 26

The method may further include forming solder (not shown) on the pads 22, 26 within the patterns of the resists 24, 30 on the front and back sides 14, 16 of the substrate 10. The solder may be formed on the pads 22, 26 using any conventional technique.

The electrolytic nickel 28 on the pads 22, 26 may provide a barrier that facilitates the reduction of electro-migration which may occur between the copper and solder within the finished pads, especially in high current applications. The electrolytic nickel 28 may also compatible with the resists 24, 30 that are patterned to form openings 33 (FIG. 5). The openings 33 may be adapted to receive the solder that may be necessary to finish pads 22, 26.

Figure 6:
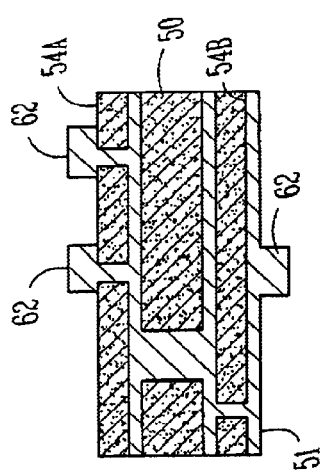

FIGS. 6–10 illustrate another method of forming a substrate, such as a high density interconnect substrate for an integrated circuit, in accordance with various embodiments. As shown in FIG. 6, the method may include applying a conductive layer 51, such as a copper layer, to one side 54B of a substrate 50 that includes pads 62 and/or interconnects on both sides 54A, 54B of the substrate 50.

Figure 7:
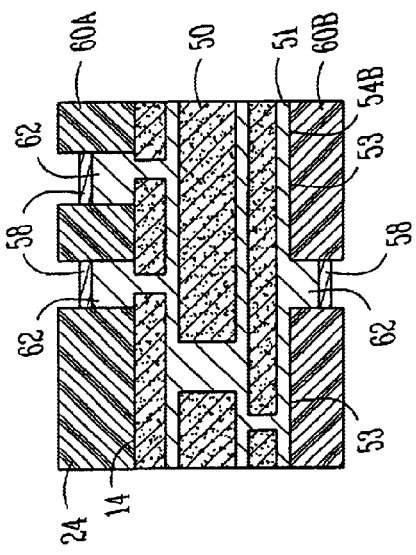
FIGS. 6–10 illustrate another method of forming a substrate.

FIG. 7 illustrates that the method may further include applying resists 60A, 60B to both sides 54A, 54B of the substrate 50 and then forming a pattern in each resist 60A, 60B which exposes the pads 62 on both sides 54A, 54B of the substrate 50. The method may also include applying electrolytic nickel 58 to some or all of the pads 62 on one or both sides 54A, 54B of the substrate 50. In various embodiments, gold may be applied to the electrolytic nickel 58 by various processes, such as plating, since the pads 62 may still be electrically connected in part by the conductive layer 51.

Figure 8:
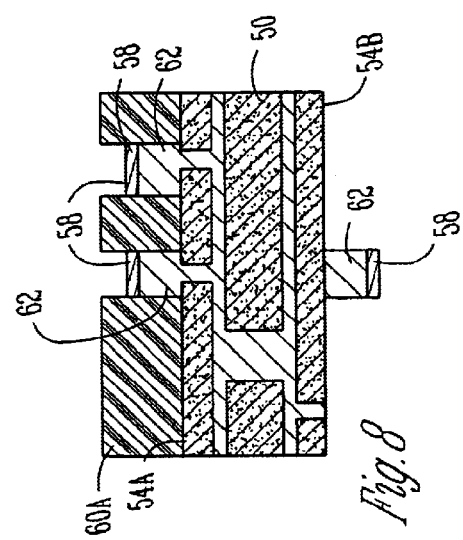

As shown in FIG. 8, the method may further include removing the resist 60B from the side 54B of the substrate 50 that includes the conductive layer 51. In addition, a part 53 (see FIG. 7) of the conductive layer 51 may be removed from the substrate 50 to define the pads 62 and/or interconnects that are on the side 54B of the substrate 50 which had included the conductive layer 51.

Figure 9:
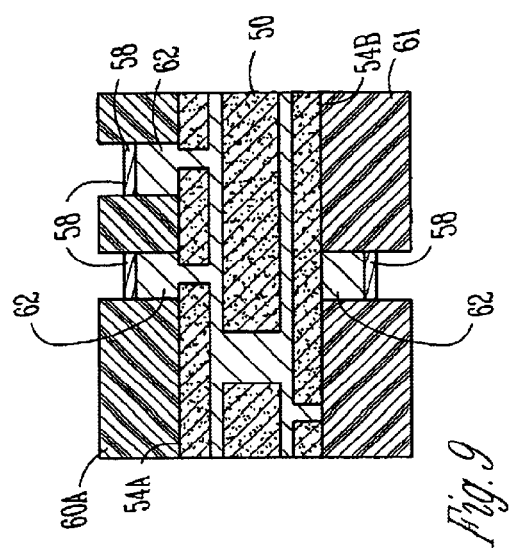

FIG. 9 illustrates that the method may further include applying another resist 61 to the side 54B of the substrate 50 which had included the conductive layer 51. A pattern may then formed in the resist 61 to expose the pads 62 on the side 54B of the substrate 50 that had previously included the conductive layer 51.

Figure 10:
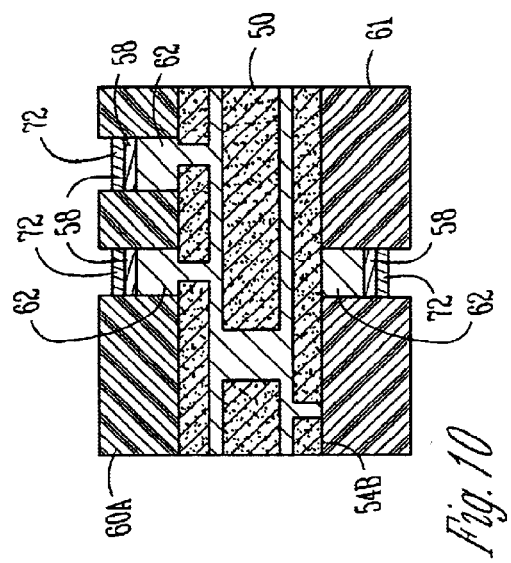

The method may further include applying gold, such as electroless gold 72, to the electrolytic nickel 58 that may be on the pads 62 which are within the pattern of one or both of the resists 60A, 61 on the substrate 50 (see FIG. 10). In various embodiments, the method may include forming solder (not shown) on the pads 62 within the patterns of the resists 60A, 61 on both sides 54A, 54B of the substrate 50.

Figure 11:
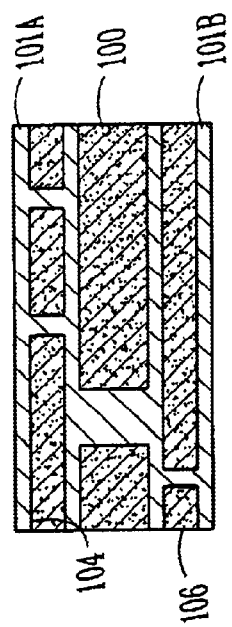

FIGS. 11–19 illustrate another method of forming a substrate, such as a high density interconnect substrate for an integrated circuit, in accordance with various embodiments. The method may include applying conductive layers 101A, 101B to a front side 104 and a back side 106 of a substrate 100 (FIG. 11).

Figure 12:
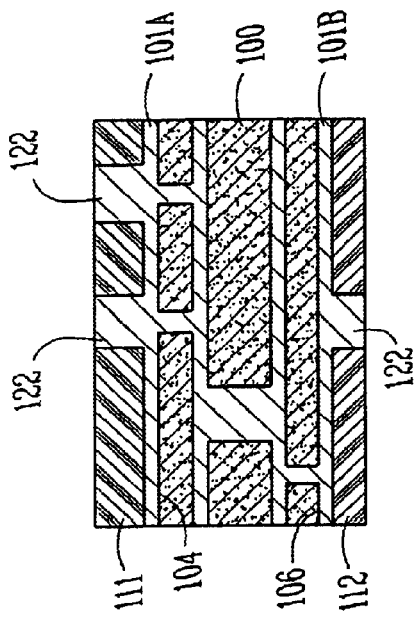

As shown in FIG. 12, the method may further include applying a first resist 111 to the front side 104 of the substrate 100 and a second resist 112 to the back side 106 of the substrate 100. The method may further include forming patterns in the first resist 111 and the second resist 112. The method may further include applying conductive material to the conductive layers 101A, 101B to form pads 122 within the pattern of the first and second resists 111, 112.

Figure 14:
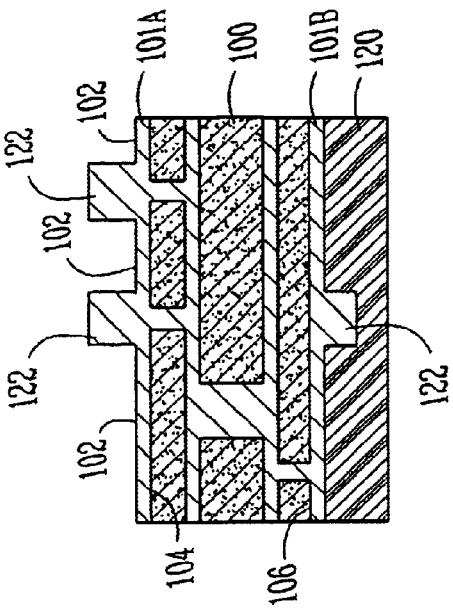
Figure 13:
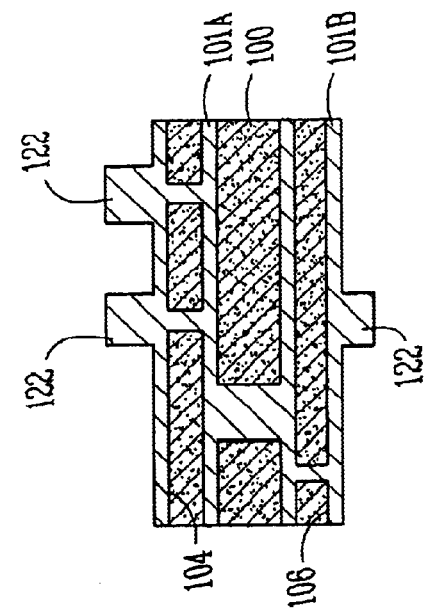

FIGS. 13 and 14 show that the method may further include removing the first and second resists 111, 112 from the front and back sides 104, 106 of the substrate 100 (FIG. 13), and applying a third resist 120 to the back side 106 of the substrate 100 (FIG. 14). As shown in FIG. 15, the method may further include removing part 102 (see FIG. 14) of the conductive layer 101A from the front side 104 of the substrate 100 to define the pads 122 and/or interconnects on the front side 104 of the substrate 100.

FIG. 16 shows that the method may further include applying a fourth resist 130 to the front side 104 of the substrate 100. The method may further include forming patterns in the third and fourth resists 120, 130 to expose the pads 122 on the front and back sides 104, 106 of the substrate 100. The method may further include applying electrolytic nickel 138 to some, or all, of the pads 122 on the substrate 100. As discussed above, applying electrolytic nickel 138 to the pads 122 on the substrate 100 may include applying current to the substrate 100 while the substrate 100 is immersed in an electrolyte that includes nickel ions.

FIG. 17 illustrates that the method may further include removing the third resist 120 from the back side 106 of the substrate 100 and removing a part 103 (see FIGS. 15 and 16) of the conductive layer 101B from the back side 106 of the substrate 100 to form the pads 122 and/or interconnects on the back side 106 of the substrate 100. As shown in FIG. 18, the method may further include applying a fifth resist 140 to the back side 106 of the substrate 100 and forming a pattern in the fifth resist 140 that exposes the pads 122 on the back side 106 of the substrate 100.

FIG. 19 illustrates that the method may further include applying gold 139, such as electroless gold, to the electrolytic nickel 138 that may be on the pads 122. The gold 139 may be applied within the pattern of one, or both, of the fourth and fifth resists 130, 140 on the front and/or back sides 104, 106 of the substrate 100. In various embodiments, gold 139 may be applied to the electrolytic nickel 138 by various processes, such as plating, while all of the pads 122 are still electrically connected by the conductive layer 101B (see FIG. 16). The method may also include forming solder on the pads 122 that are within the patterns of the resists 130, 140 on the front and/or back sides 104, 106 of the substrate 100.

FIGS. 20–25 illustrate a method of forming an integrated circuit assembly 200 (see FIG. 25) in accordance with various embodiments. As shown in FIG. 20, the method may include applying a resist 160 to a back side 156 of a substrate 150 that includes patterned conductive layers 151A, 151B with pads 162 formed on a front side 154 and a back side 156 of the substrate 150. FIG. 21 shows that the method may further include removing a part 152 (see FIG. 20) of the patterned conductive layer 151A from the front side 154 of the substrate 150 to further define the pads 162 and/or interconnects on the front side 154 of the substrate 150.

FIG. 22 shows that the method may further include applying another resist 170 to the front side 154 of the substrate 150. The method may further include forming a pattern in each resist 160, 170 that exposes the pads 162 on the front and back sides 154, 156 of the substrate 150. The method may further include applying electrolytic nickel 168 to some or all of the pads 162 on one or both sides 154, 156 of the substrate 150.

Figure 25:
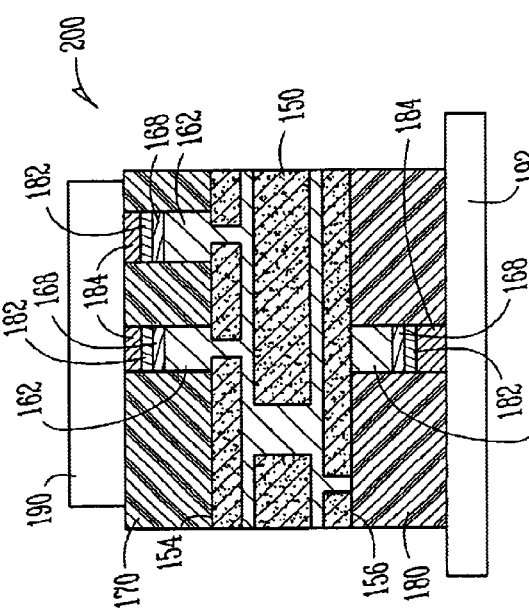

As shown in FIG. 25, the method may further include forming solder 184 on the pads 162 and attaching at least one electronic component to the pads 162 on the front and/or back sides 154, 156 of the substrate 150. In the example illustrated in FIG. 25, a die 190 may be attached to the pads 162 on the front side 154 of the substrate 150 and a board 192 (e.g., a motherboard) may be attached to the pads 162 on the back side 156 of the substrate 150. In various embodiments, at least one additional electronic component may be attached to the pads 162 on the front and/or back sides 154, 156 of the substrate 150 to form integrated circuit assembly 200. As examples, die 190 may be a processor or a wireless transceiver.

Figure 23:
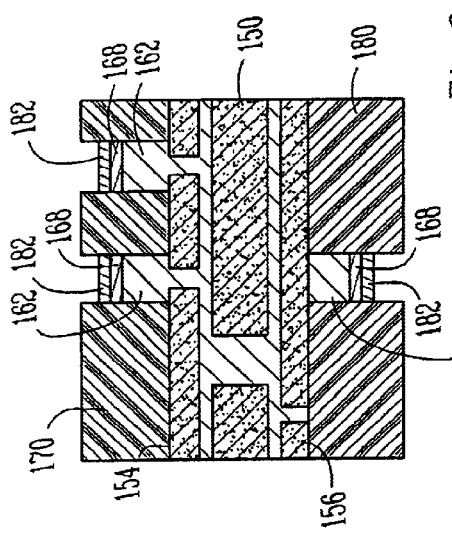
Figure 24:
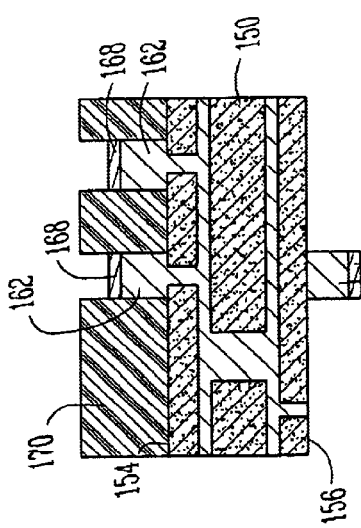

FIG. 23 illustrates that forming solder on the pads 162 may include removing the resist 160 from the back side 154 of the substrate 150. The method may further include removing a pat 153 (see FIG. 22) of the conductive layer 151B from the back side 156 of the substrate 150 to further define the pads 162 and/or interconnects on the back side 156 of the substrate 150. As shown in FIG. 24, the method may also include applying a further resist 180 to the back side 154 of the substrate 150 and forming a pattern in the resist 180 that exposes the pads 162 on the back side 156 of the substrate 150.

FIGS. 24 and 25 illustrate that the method may further include applying gold 182, such as electroless gold, to the electrolytic nickel 168 that is within the pattern of one, or both, of the resists 170, 180 before the solder 184 (FIG. 25) is formed on the pads 162. In various alternative embodiments, gold 182 may be applied to the electrolytic nickel 168 by various processes, such as plating, before the part 153 of the conductive layer 151B is removed from the substrate 150 (see FIG. 22).

The example methods described herein may be used in forming high density interconnect substrates that include pads formed of copper and solder. The copper portions of the pads in the substrate are formed with an electrolytic nickel surface finish that provides a barrier which reduces electromigration between the solder and the copper. The electrolytic nickel surface finish on the copper portion of the pads may also be compatible with the solder resists that are used to form openings which receive solder on top of the copper portion of the pads.

Figure 26:
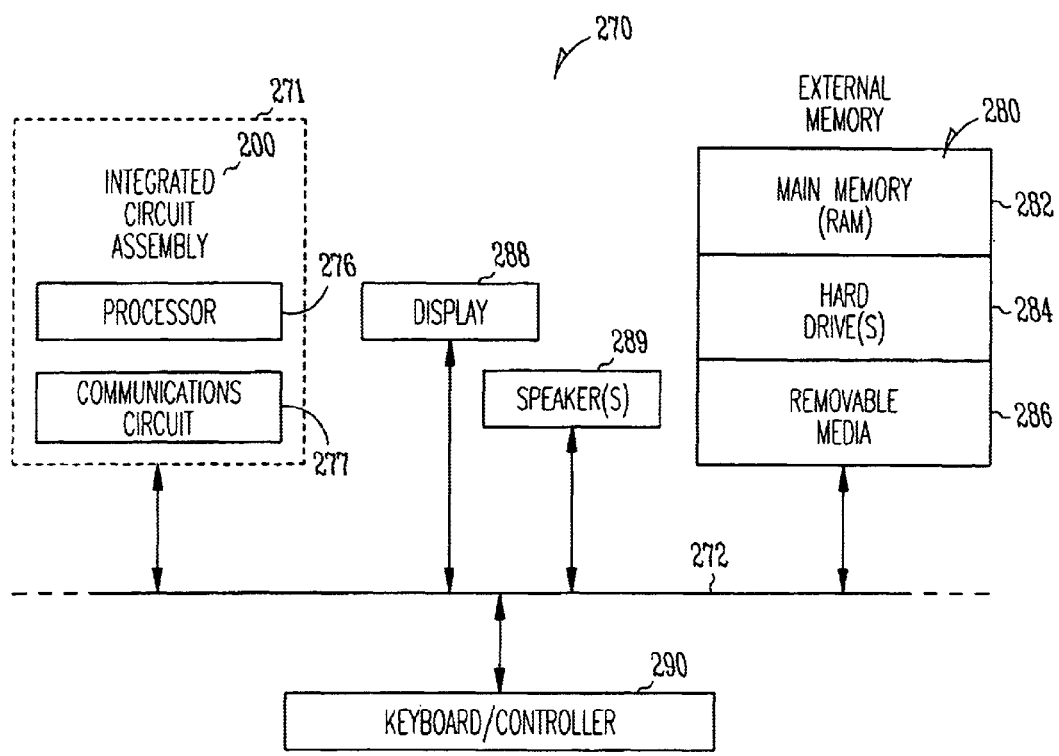
FIG. 26 is a block diagram illustrating an electronic system incorporating at least one integrated circuit assembly of the type shown in FIG. 25.

FIG. 26 illustrates a block diagram of an electronic system 270, such as a computer system, that may include an electronic device 271 which may be coupled to various components in electronic system 270 via a system bus 272. Electronic device 271 may include at least one integrated circuit, such as integrated circuit assembly 200 shown in FIG. 25. Electronic device 271 may further include a microprocessor, a microcontroller, a graphics processor or a digital signal processor 276, and/or a custom circuit or an application-specific integrated circuit, such as communications circuit 277 for use in wireless devices such as cellular telephones, pagers, portable computers, two-way radios, and similar electronic systems. System bus 272 may be a single bus or any combination of busses.

The electronic system 270 may also include an external memory 280 that in turn includes one or more memory elements suitable to the particular application, such as a main memory 282 in the form of random access memory (RAM), one or more hard drives 284, and/or one or more drives that handle removable media 286, such as floppy diskettes, compact disks (CDs) and digital video disks (DVDs).

The electronic system 270 may also include a display device 288, a speaker 289, and a controller 290, such as a keyboard, mouse, trackball, game controller, microphone, voice-recognition device, or any other device that inputs information into the electronic system 272.

FIGS. 1–26 are merely representational and are not drawn to scale. Certain proportions thereof may be exaggerated, while others may be minimized. Many other embodiments will be apparent to those of skill in the art upon reviewing the above description.

Many other embodiments will be apparent to those of skill in the art from the above description. The scope of the invention should be determined with reference to the appended claims along with the full scope of equivalents to which the claims are entitled.

What is claimed is:

1. A method of forming a substrate, the method comprising:

applying a resist to a back side of a substrate having patterned conductive layers on a front side and the back side of the substrate;

removing part of the patterned conductive layer from the front side of the substrate to form pads and interconnects on the front side of the substrate;

applying another resist to the front side of the substrate;

forming a pattern in each resist that exposes the pads on the front and back sides of the substrate; and applying electrolytic nickel to the pads on the substrate.

2. The method of claim 1 further comprising applying gold to the electrolytic nickel on the pads by plating.

3. The method of claim 1 further comprising:

removing the resist from the back side of the substrate; and removing a part of the conductive layer from the back side of the substrate to form pads and interconnects on the back side of the substrate.

4. The method of claim 3 further comprising:

applying a further resist to the back side of the substrate; and forming a pattern in the resist that exposes the pads on the back side of the substrate.

5. The method of claim 4 further comprising applying gold to the electrolytic nickel on the pads that are within the pattern of at least one of the resists on the front and back sides of the substrate.

6. The method of claim 4 further comprising forming solder on the pads that are within the pattern of at least one of the resists on the front and back sides of the substrate.

7. The method of claim 1 wherein applying electrolytic nickel to the pads on the substrate includes applying electrolytic nickel to the pads on one of the front and back sides of the substrate.

8. A method of forming a substrate, the method comprising:

applying a conductive layer to one side of a substrate that includes pads and interconnects on both sides of the substrate;

applying a resist to both sides of the substrate;

forming a pattern in each resist that exposes the pads on both sides of the substrate; and applying electrolytic nickel to the pads on the substrate.

9. The method of claim 8 further comprising applying gold to the electrolytic nickel on the pads by plating.

10. The method of claim 8 wherein applying electrolytic nickel to the pads on the substrate includes applying electrolytic nickel to the pads on one of the front and back sides of the substrate.

11. The method of claim 8 further comprising:

removing the resist from the side of the substrate that includes the conductive layer; and removing a part of the conductive layer from the substrate to redefine the pads and interconnects on the side of the substrate that were joined by the conductive layer.

12. The method of claim 11 further comprising:

applying a resist to the side of the substrate that had included the conductive layer; and forming a pattern in the resist to expose the pads on the side of the substrate that had included the conductive layer.

13. The method of claim 12 further comprising applying gold to the electrolytic nickel on the pads that are within the pattern of at least one of the resists on the substrate.

14. The method of claim 13 further comprising forming solder on the pads that are within the pattern of at least one of the resists on the substrate.

15. A method of forming a substrate, the method comprising:

applying a conductive layer to a front side and a back side of a substrate;

applying a first resist to the front side of the substrate and a second resist to the back side of the substrate;

forming patterns in the first resist and the second resist;

applying conductive material within the pattern of the first and second resists to the conductive layer;

removing the first and second resists from the front and back sides of the substrate;

applying a third resist to the back side of the substrate;

removing part of the conductive layer from the front side of the substrate to form pads and interconnects on the front side of the substrate;

applying a fourth resist to the front side of the substrate;

forming patterns in the third and fourth resists to expose the pads on the front and back sides of the substrate;

applying electrolytic nickel to the pads on the substrate;

removing the third resist from the back side of the substrate;

removing a part of the conductive layer from the back side of the substrate to form pads and interconnects on the back side of the substrate;

applying a fifth resist to the back side of the substrate; and forming a pattern in the fifth resist that exposes the pads on the back side of the substrate.

16. The method of claim 15 further comprising applying gold to the electrolytic nickel on the pads by plating before the conductive layer is removed from the back side of the substrate.

17. The method of claim 15 further comprising applying gold to the electrolytic nickel on the pads that are within the pattern of at least one of the third and fifth resists.

18. The method of claim 15 wherein applying a conductive layer to a front side and a back side of a substrate includes applying a copper layer to a front side and a back side of a substrate.

19. The method of claim 15 further comprising forming solder on the pads that are within the pattern of at least one of the third and fifth resists.

20. The method of claim 15 wherein applying electrolytic nickel to the pads on the substrate includes applying current to the substrate while the substrate is immersed in an electrolyte that includes nickel ions.

21. A method of forming an integrated circuit assembly, the method comprising:

applying a resist to a back side of a substrate that includes patterned conductive layers on a front side and a back side of the substrate;

removing part of the patterned conductive layer from the front side of the substrate to form pads and interconnects on the front side of the substrate;

applying another resist to the front side of the substrate;

forming a pattern in each resist that exposes the pads on the front and back sides of the substrate;

applying electrolytic nickel to the pads on the substrate;

forming solder on the pads that are within the pattern of at least one of the resists on the front and back sides of the substrate; and coupling an electronic component to the solder in the pads on one the front and back sides of the substrate.

22. The method of claim 21 wherein attaching an electronic component to the pads on one the front and back sides of the substrate includes attaching a die to the pads on the front side of the substrate.

23. The method of claim 22 wherein attaching an electronic component to the pads on one the front and back sides of the substrate includes attaching a board to the pads on the back side of the substrate.

24. The method of claim 21 further comprising applying gold to the electrolytic nickel on the pads by plating before forming solder on the pads.

25. The method of claim 21 wherein the electronic component is a processor.

26. The method of claim 21 wherein the electronic component is a wireless transceiver.

27. The method of claim 21 wherein forming solder on the pads comprises:

removing the resist from the back side of the substrate;

removing a part of the conductive layer from the back side of the substrate to form pads and interconnects on the back side of the substrate;

applying another resist to the back side of the substrate; and forming a pattern in the another resist that exposes the pads on the back side of the substrate.

* * * * *